United States Patent [19]
Xu et al.

[11] Patent Number: 5,847,461
[45] Date of Patent: Dec. 8, 1998

[54] INTEGRATED CIRCUIT STRUCTURE HAVING CONTACT OPENINGS AND VIAS FILLED BY SELF-EXTRUSION OF OVERLYING METAL LAYER

[75] Inventors: Zheng Xu, Foster City; Tse-Yong Yao; Hoa Kieu, both of Sunnyvale; Julio Aranovich, Palo Alto, all of Calif.

[73] Assignee: Applied Materials, Inc., Santa Clara, Calif.

[21] Appl. No.: 664,717

[22] Filed: Jun. 17, 1996

Related U.S. Application Data

[62] Division of Ser. No. 435,774, May 5, 1995, Pat. No. 5,668,055.

[51] Int. Cl.$^6$ ............ H01L 23/48; H01L 23/52; H01L 29/40
[52] U.S. Cl. ............ 257/751; 257/771; 257/774; 257/764; 257/760
[58] Field of Search ............... 257/751, 763, 257/764, 770, 771, 768, 760, 774; 438/593, 595, 622, 761, 688

[56] References Cited

U.S. PATENT DOCUMENTS

| | | | |
|---|---|---|---|
| 4,587,138 | 5/1986 | Yau et al. ............ | 427/88 |
| 5,288,664 | 2/1994 | Mukai ............ | 437/173 |
| 5,409,862 | 4/1995 | Wada et al. ............ | 437/197 |
| 5,427,982 | 6/1995 | Jun ............ | 437/195 |
| 5,563,448 | 10/1996 | Lee et al. ............ | 257/751 |

FOREIGN PATENT DOCUMENTS

| | | | |
|---|---|---|---|
| 44 08 564 | 3/1994 | Germany ............ | H01L 21/312 |
| 63-311742 | 12/1988 | Japan ............ | H01L 21/88 |
| 2-116124 | 4/1990 | Japan ............ | 257/751 |
| 5-121727 | 5/1993 | Japan ............ | 257/751 |
| 6-13380 | 1/1994 | Japan ............ | 257/751 |
| WO 94/24330 | 10/1994 | WIPO ............ | C23C 14/00 |

*Primary Examiner*—Mahshid D. Saadat
*Assistant Examiner*—Jhihan B. Clark
*Attorney, Agent, or Firm*—John P. Taylor; Donald Verplancken

[57] ABSTRACT

A process and resulting structure are described for using a metal layer formed over an insulating layer as both the filler material to fill openings in the insulating layer and as the patterned metal interconnect or wiring harness on the surface of the insulating layer. The process includes the steps of forming a compressively stressed metal layer over an insulating layer having previously formed openings therethrough to the material under the insulating layer; forming a high tensile strength cap layer of material over the compressively stressed metal layer; and then heating the structure to a temperature sufficient to cause the compressively stressed metal layer to extrude down into the openings in the underlying insulating layer. The overlying cap layer has sufficient tensile strength to prevent or inhibit the compressive stressed metal layer from extruding upwardly to form hillocks which would need to be removed, i.e., by planarization. The temperature to which the compressively stressed metal layer is subsequently heated to cause it to extrude should be less than the melting point of the compressively stressed metal layer.

14 Claims, 3 Drawing Sheets

FORMING A BARRIER LAYER OVER AN INSULATING LAYER ON AN INTEGRATED CIRCUIT STRUCTURE AND OVER SURFACES OF OPENINGS FORMED IN THE INSULATING LAYER, INCLUDING EXPOSED SURFACES OF THE INTEGRATED CIRCUIT STRUCTURE AT THE BOTTOM OF THE OPENINGS

FORMING A COMPRESSIVELY STRESSED METAL LAYER OVER THE INSULATING LAYER AND OVER THE OPENINGS FORMED IN THE INSULATING LAYER

FORMING A HIGH TENSILE STRENGTH CAPPING LAYER OVER THE COMPRESSIVELY STRESSED METAL LAYER TO PREVENT UPWARD EXTRUSION OF THE METAL LAYER UPON SUBSEQUENT HEATING OF THE STRUCTURE

HEATING THE STRUCTURE SUFFICIENTLY TO CAUSE THE METAL LAYER TO EXTRUDE DOWNWARDLY INTO THE OPENINGS IN THE INSULATION LAYER TO FILL THE OPENINGS BUT INSUFFICIENT TO MELT THE METAL LAYER

FIG. 5

INTEGRATED CIRCUIT STRUCTURE HAVING CONTACT OPENINGS AND VIAS FILLED BY SELF-EXTRUSION OF OVERLYING METAL LAYER

CROSS-REFERENCE TO RELATED APPLICATIONS

This application is a division of U.S. patent application Ser. No. 08/435,774, filed May 5, 1995 now U.S. Pat. No. 5,668,055.

BACKGROUND OF THE INVENTION

1. Field of the Invention

This invention relates to integrated circuit structures. More particularly, this invention relates to a process for filling contact openings and vias in an insulating layer with the same metal used for forming a metal interconnect or wiring harness over the insulating layer.

2. Description of the Related Art

In the formation of integrated circuit structures, an insulating layer is formed over the active devices, or over a patterned underlying metal interconnect layer, and vertical openings are then formed through this insulating layer to provide electrical communication from the upper surface of the insulating layer to the underlying active device or electrical interconnect. Such openings are then filled with an electrically conductive material to provide electrical connection between the underlying elements and conductive materials, such as a metal interconnect or wiring harness, subsequently formed on the surface of the insulating material.

When an opening is formed through the first insulating layer down to the active device (or associated passive devices such as resistors) the opening through the insulating layer is usually referred to as a contact opening, while an opening through a subsequent insulating layer to an underlying metal interconnect is usually referred to as a via. For purposes of this invention, no distinction will be made between the terms "via" and "contact opening" and the terms will be used interchangeably herein.

Aluminum has been the metal or alloy of choice for use in the formation of patterned interconnects or "wiring" on the surface of insulating layers, due to its high conductivity, low cost, and compatibility with other materials used in the construction of the integrated circuit structure. In the past, when larger dimensions were used for line widths and contact opening diameters, contact openings or vias were formed in the insulating layer and a layer of aluminum was then formed over the insulating layer which also filled the contact openings as well, although barrier material, such as TiN was usually used when the aluminum would otherwise contact silicon, to avoid migration of Si or Al atoms into the other material.

However, as dimensions of lines and contact openings decreased, with ever increasing scale of VLSI structures, problems arose with securing satisfactory filling of the entire contact opening with the aluminum used to form the contact layer over the insulating layer. This, in turn, has given rise to the use of other filler materials such as tungsten to fill the contact opening prior to the formation of the aluminum layer over the insulating layer. After formation of, for example, a barrier layer of TiN, a layer of tungsten is deposited over the barrier layer and insulating layer which also fills the contact opening after which the structure is planarized to remove all of the surface tungsten (leaving only the tungsten in the contact openings). The aluminum layer is then formed over the insulating layer which aluminum layer thereby makes electrical contact with the upper exposed surface of the underlying tungsten in the contact opening.

While this approach has solved the problem of adequate filling of small contact openings with conductive material, the use of tungsten as a filler material results in other problems. Filling the openings with tungsten adds further deposition and planarization steps to the process, resulting in more complexity, more cost, and less reliability. In addition, the use of tungsten metal results in higher particle formation possibilities, higher resistivity of the tungsten compared to aluminum, and a metal interface wherein the crystallographic disposition of the tungsten can, in turn, affect the crystallographic form of the aluminum subsequently deposited therein, i.e., by the tungsten surface providing a seed surface for the aluminum deposition, thereby sometimes resulting in the subsequent formation of a less desirable crystallographic form of aluminum. It would, therefore, be highly desirable to be able to fill very small diameter openings in an insulation layer with metal such aluminum initially deposited on the surface of the insulating layer and then later patterned to form a metal interconnect layer, i.e., to use the same metal to both fill the openings in the insulation layer and to form the electrically conductive interconnect or wiring harness on the surface of the insulating layer.

SUMMARY OF THE INVENTION

The invention provides a process whereby a metal layer may be used over an insulating layer to form both the filler material used to fill openings in the insulating layer and the patterned metal interconnect or wiring harness on the surface of the insulating layer.

The process comprises the steps of forming a metal layer in compressive stress over an insulating layer having previously formed openings therethrough to the material under the insulating layer; forming a tensile strained cap layer of material over the metal layer in compressive stress; and then heating the structure to a temperature sufficient to cause the metal layer in compressive stress to extrude down into the openings in the underlying insulating layer. The overlying tensile strained cap layer has sufficient tensile strength to prevent or inhibit the compressive stressed metal layer from extruding upwardly to form hillocks which would need to be removed, i.e., by planarization, and the temperature to which the metal layer in compressive stress is subsequently heated should be less than the melting point of the metal layer in compressive stress.

DESCRIPTION OF THE DRAWINGS

FIG. 5 is a flowsheet illustrating the process of the invention.

DETAILED DESCRIPTION OF THE INVENTION

The process of the invention comprises the filling of one or more openings in an insulating layer with metal by extruding, into the one or more openings, metal from a compressively stressed metal layer formed over the insulating layer.

Figure 1:
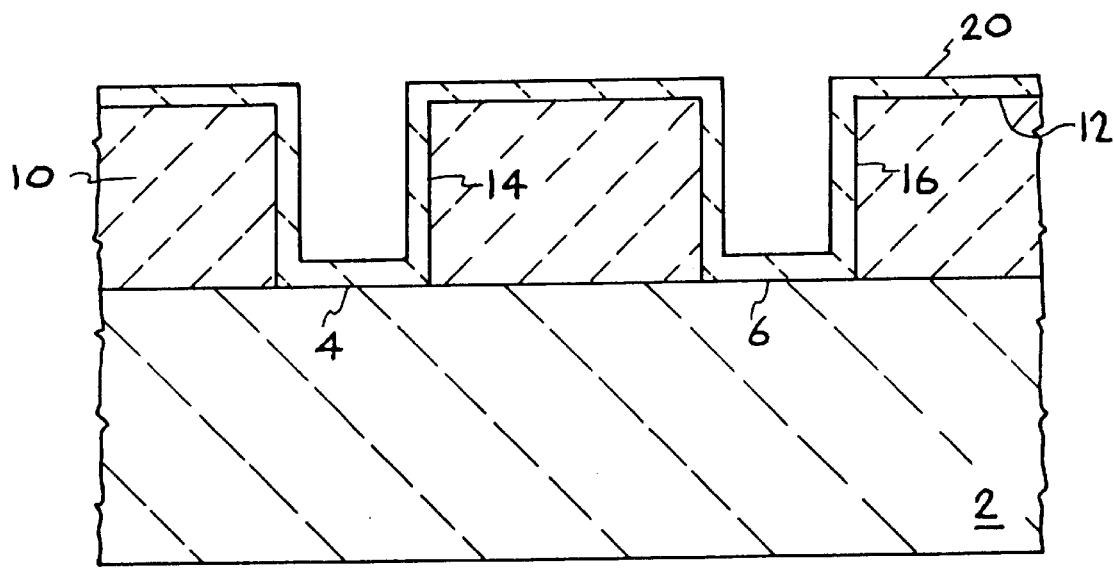
FIG. 1 is a fragmentary vertical cross-sectional view of an integrated circuit structure having an insulating layer formed thereover with openings formed in the insulating layer down to the underlying structure, and a barrier layer formed over the exposed surface of the underlying structure, the sidewalls of the openings, and the surface of the insulating layer.

Turning to FIG. 1, an integrated circuit structure is shown at 2 having an insulating layer 10 formed over integrated circuit structure 2. Openings 14 and 16 are shown formed in insulating layer 10 which extent downwardly from upper surface 12 of insulating layer 10 to exposed surfaces 4 and 6 of integrated circuit structure 2 at the bottom of openings 14 and 16. A barrier layer 20 is shown formed over upper surface 12 of insulating layer 10 as well as over the sidewalls of openings 14 and 16 and over exposed surfaces 4 and 6 of integrated circuit structure 2 at the respective bottoms of openings 14 and 16.

Integrated circuit structure 2 may comprise a silicon substrate having active devices such as, for example, MOS devices formed therein whereby openings 14 and 16 in insulating layer 10 could comprise a via to provide an electrical connection, for example, to the source or drain regions or to the gate electrode. Alternatively, integrated circuit structure 2 might comprise the foregoing structure having a first insulating layer previously formed thereon with a patterned layer of metal interconnects formed thereon prior to the formation of insulating layer 10 thereon, in which case openings 14 and 16 would comprise contact openings to provide electrical connection to the underlying metal interconnect layer.

While the size or diameter of openings 14 and 16 may vary, the invention finds its greatest utility, and is intended to be utilized for small openings, i.e., openings smaller than about 0.5 microns in diameter, since larger openings usually can be filled during the formation of metal layer 30 without the need for the process of the invention. That is, the practice of the invention is particularly intended to solve the problem of inadequate filling of small vias or contact openings during the formation of metal layer 30.

Insulating layer 10 may comprise any conventionally used insulation material such as, for example, silicon oxide or silicon nitride, but will usually comprise silicon oxide. Therefore, by way of example, and not of limitation, insulating layer will hereinafter be referred to interchangeably as insulating layer 10 or oxide layer 10.

Barrier layer 20 comprises a thin layer of an electrically conductive material which is used to form a chemical barrier between the metal used to fill openings 14 and 16 and the underlying material comprising integrated circuit structure 2 to prevent interaction therebetween.

For example, if underlying integrated circuit structure 2 comprises silicon and aluminum is used to fill openings 14 and 16, barrier layer 20 must be formed over exposed silicon surfaces 4 and 6 at the respective bottoms of openings 14 and 16 to prevent migration of silicon atoms into the aluminum or spiking from the aluminum down into the underlying silicon. However, if the underlying integrated circuit structure to be connected to through openings 14 and 16 comprises an underlying patterned aluminum interconnect, and the material to be used to fill openings 14 and 16 also comprises aluminum, barrier layer 20 could be eliminated.

Typically, when barrier layer 20 is used it will be formed to a thickness of at least about 150 Angstroms to provide the desired chemical barrier. However, since the barrier layer is usually formed of a material (such as TiN) which is not as conductive as the metal used to fill openings 14 and 16, the use of excessive thicknesses beyond the minimum amount needed to provide the desired chemical barrier is usually avoided. Typically, the thickness of the barrier layer will, therefore, usually not exceed about 300 Angstroms to provide sufficient remaining volume in the openings for the filling thereof with the electrically conductive metal filler material. The process parameters (i.e., temperature and pressure) used during the formation of barrier layer 20 may comprise any processing parameters conventionally used in such formation of barrier layers, as is well known to those skilled in the art.

Figure 2:
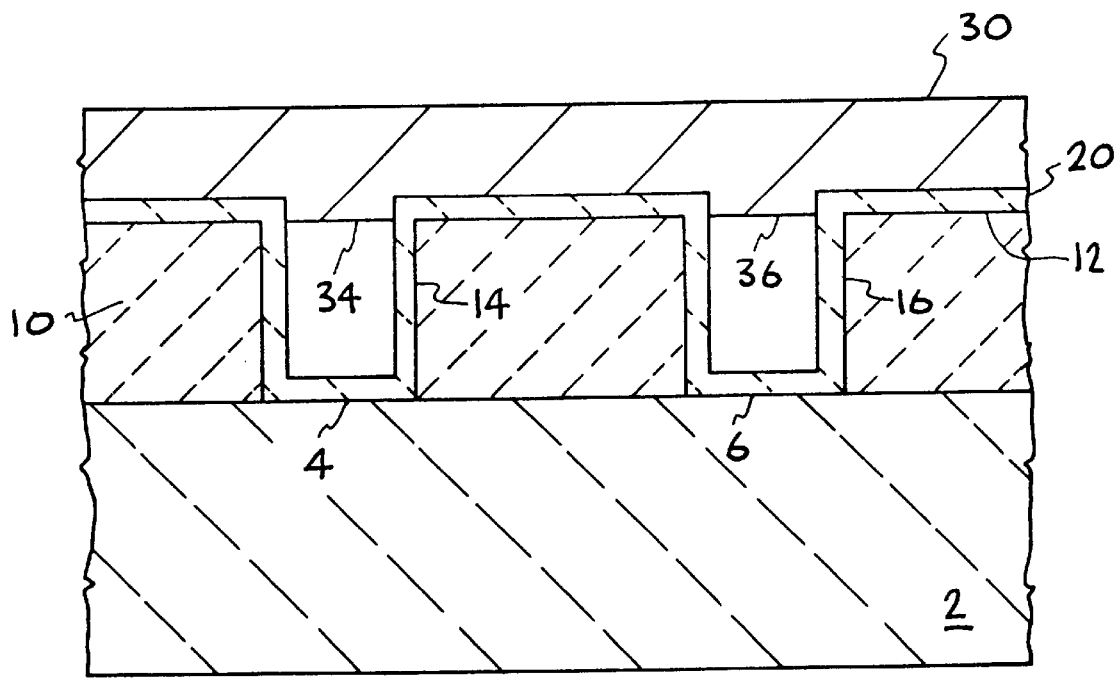
FIG. 2 is a fragmentary vertical cross-sectional view of the structure of FIG. 1 after the formation of a compressively stressed metal layer over the insulating layer and over the top of the openings therein.

FIG. 2 shows the structure of FIG. 1 after the formation thereover of patternable metal layer 30, comprising a layer of compressively stressed metal which will subsequently be extruded down into openings 14 and 16, in accordance with the process of the invention, to completely fill openings 14 and 16 and to provide electrical connections between metal layer 30 and underlying integrated circuit structure 2. It will be noted that the initial formation of metal layer 30 does not result in a filling of openings 14 and 16, but as shown at 34 and 36, metal layer 30 does cover openings 14 and 16 and may extend downwardly slightly into the top of openings 14 and 16.

Metal layer 30 may comprise any electrically conductive metal layer capable of being formed as a layer in compressive stress over insulating layer 20. Typically, metal layer 30 will comprise aluminum, although other metals or metal alloys which are not incompatible with other materials in the integrated circuit structure, such as gold, silver, the platinum metals, or alloys of same, could be used instead of an aluminum-bearing material. The use of the term "aluminum" herein is meant to include both pure aluminum, i.e., 99+wt. % aluminum, as well as aluminum alloys, i.e., alloys containing 90 wt. % or more aluminum such as, for example, an aluminum-copper alloy containing 90 wt. % or more aluminum. For purposes of illustration, and not of limitation, metal layer 30 will, hereinafter, be referred to either as metal layer 30 or as aluminum layer 30.

Aluminum layer 30 will be formed of a thickness sufficient to cover the top of openings 14 and 16, as shown in FIG. 2, and to provide a sufficient reservoir of metal to permit the desired subsequent extrusion of metal into openings 14 and 16 to completely fill openings 14 and 16 with such aluminum metal down to underlying integrated circuit structure 2. Such a minimum amount is, at present, thought to be about 6000 Angstroms when the diameter of openings 14 and 16 is about 2500 Angstroms. Minimum amounts below this may exist and may be empirically determined, if desired, for various other sizes of openings to be filled with filler metal from metal layer 30. It should, however, be noted that unless a further layer of aluminum or other conductive metal will be formed over metal layer 30, as will be discussed below, the minimum thickness of metal layer 30 must also take into account the amount of current which must be handled by the metal interconnects which will be formed from the subsequent patterning of metal layer 30. Normally this desired characteristic will result in the use of an aluminum layer having a thickness of at least 4000 Angstroms.

The maximum thickness of aluminum layer 30 will depend upon the planarization requirements of the integrated circuit structure, since thicker layers will result in greater needs for subsequent planarization of conformal insulation layer(s) such as oxide deposited over the metal interconnects formed by subsequent patterning of the metal layer. For aluminum, a thickness not exceeding about 1 micron should usually be sufficient. If, for purposes of practicing this invention, a thicker layer of metal is desired, such an excessive thickness could be subsequently removed, for example, by chemical-mechanical polishing (CMP) subsequent to the extrusion step and prior to patterning of the metal layer.

By use of the term "compressive stress" (with respect to metal layer 30 formed over insulation layer 20) is meant a range of compressive stress from the minimum amount of compressive stress needed to provide the desired subsequent extrusion up to a maximum below that amount of stress which would cause other layers of the integrated circuit structure to crack. Usually the amount of compressive stress needed to accomplish these objectives will range from about $10^8$ to about $10^{10}$ dynes/cm$^2$. The compressive stress of metal layer 30 may be measured or determined by measuring the deformation of the substrate or wafer.

The formation of metal layer 30 having sufficient compressive stress to provide the desired extrusion without damage to the underlying integrated circuit structure requires a high density deposition. This may be accomplished through one of several methods, using conventional sputter deposition processes with the exception of certain deposition parameters. One way to deposit a compressively stressed aluminum layer 30 is to conventionally sputter aluminum onto the integrated circuit structure while, however, maintaining a negative bias from an RF source on a conductive support on which a substrate containing the integrated circuit structure rests. Such a negative bias may range from about −10 volts to about −100 volts, with the maximum amount of negative bias being governed by a wafer sputtering rate/ wafer deposition rate of less than 1. That is, the bias on the wafer must be maintained below a rate at which aluminum would be sputtered off the wafer as fast as or faster than it was being deposited on the wafer.

An ion gun at an energy level of from about 1 to 100 eV may be used during the sputter deposition of the compressively stressed aluminum layer to simultaneously densify the aluminum layer as it deposits on the wafer.

During the deposition of the aluminum metal comprising metal layer 30 in a compressively stressed state, it is desirable to deposit the aluminum at as low a temperature as may be achieved to maximize the compressive stress of the deposited aluminum layer. Such low temperatures may be accomplished while the deposition is carried out under vacuum by cooling the support structure (susceptor) for the substrate, i.e., through cooling coils therein as is well known to those skilled in the art, and then thermally coupling the cooled support structure to the substrate using a non-reactive gas such as helium or argon between the substrate and the support structure. The minimum temperature of the substrate during the deposition is then only limited by the boiling point of the particular gas being used as the thermal coupling gas, with the lowest temperature then being achievable by the use of helium gas, i.e., about 4° Kelvin. The use of such low deposition temperatures results in little, if any, thermal stress between the metal layer and the underlying insulating layer, e.g., oxide layer. However, when the integrated circuit structure is subsequently heated, the volume expansion of the metal layer, relative to the underlying insulating layer, will increase the stress in the metal layer, resulting in the desired extrusion. That is, the use of such a low deposition temperature will maximize the difference in temperature between the deposition temperature and the extrusion temperature to thereby maximize the amount of extrusion at the same extrusion temperature.

The pressure maintained in the chamber during the deposition of metal layer 30 may range from about 1 milliTorr (mTorr) up to as high as atmospheric pressure, provided that oxygen-containing gases are excluded from the chamber. A pressure below about 1 milliTorr is not desirable because of the poor heat transfer to the wafer under very low pressures. However, in view of the fact that the process may be carried out in one chamber of a multiple chamber apparatus where other chambers (and the vacuum interlock between the chambers) are maintained under vacuum, it is desirable to carry out the process under a low pressure of from about 1 milliTorr to about 100 milliTorr, preferably from about 1 milliTorr to about 10 mTorr, and most preferably within a range of from about 1 millitorr to about 4 milliTorr.

It should be noted that the above processes or methods of forming metal layer 30 having a compressive stress of from about $10^8$ to about $10^{10}$ dynes/cm$^2$, are only intended to be representative. Any method of deposition or formation of metal layer 30 which will result in the metal layer being in a compressive stress within the range of from about $10^8$ to about $10^9$ dynes/cm$^2$ may be utilized in the practice of this invention.

Figure 3:
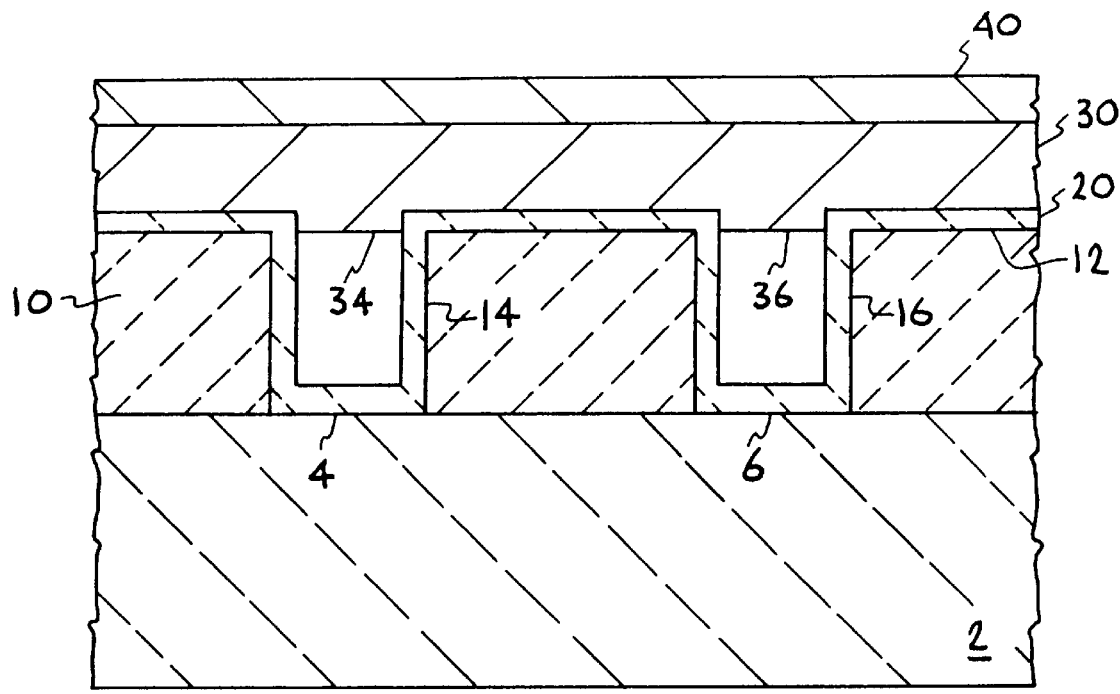
FIG. 3 is a fragmentary vertical cross-sectional view of the structure of FIG. 2 after the formation of a high tensile strength layer over the compressively stressed metal layer.

Turning now to FIG. 3, a cap layer 40 is shown formed over metal layer 30. Cap layer 40 comprises a high tensile strength material in tensile stress which is formed over compressively stressed metal layer 30 to restrain the upward movement of metal layer 30 during the subsequent extrusion step (which will be explained below) so that metal layer 30 does not move upwardly during the extrusion step, which would result in the formation of hillocks. Cap layer 40, therefore, must comprise a high tensile strength material which will not crack when compressively stressed metal layer 30 is expanding during the extrusion step. To avoid cracking and resulting formation of hillocks on the surface of the structure during the expansion of metal layer 30 during the extrusion step, the tensile strength of cap layer 40, i.e., the tensile stress to which the capping layer may be subjected without cracking, should exceed the maximum compressive stress of metal layer 30. Thus, if the compressive stress of metal layer 30 is $10^9$ dynes/cm$^2$, the minimum tensile strength of cap layer 40 must exceed $10^9$ dynes/cm$^2$. Cap layer 40 may be formed over compressively stressed metal layer 30 by any conventional method of formation, e.g., CVD formation or PVD formation, may be used which will achieve the desired formation of layer 40 with the requisite characteristics.

The term "high tensile strength" material, as used herein, is intended to define a capping layer capable of exhibiting a tensile stress exceeding the compressive stress of the underlying aluminum layer without cracking.

To achieve the desired tensile strength and tensile stress, i.e., a tensile stress which exceeds the compressive stress of metal layer 30 and a tensile strength which will prevent cracking, one must select both the type of material (for tensile stress ) and minimum thickness of same (for tensile strength). Examples of materials which can be used for cap layer 40 to provide the requisite tensile stress include carbon, silicon oxide (SiO$_2$), titanium, tungsten, and tantalum. The minimum thickness needed for each material to provide the required minimum tensile strength may be determined empirically, but typically will be at least about 1000 Angstroms.

Figure 4:
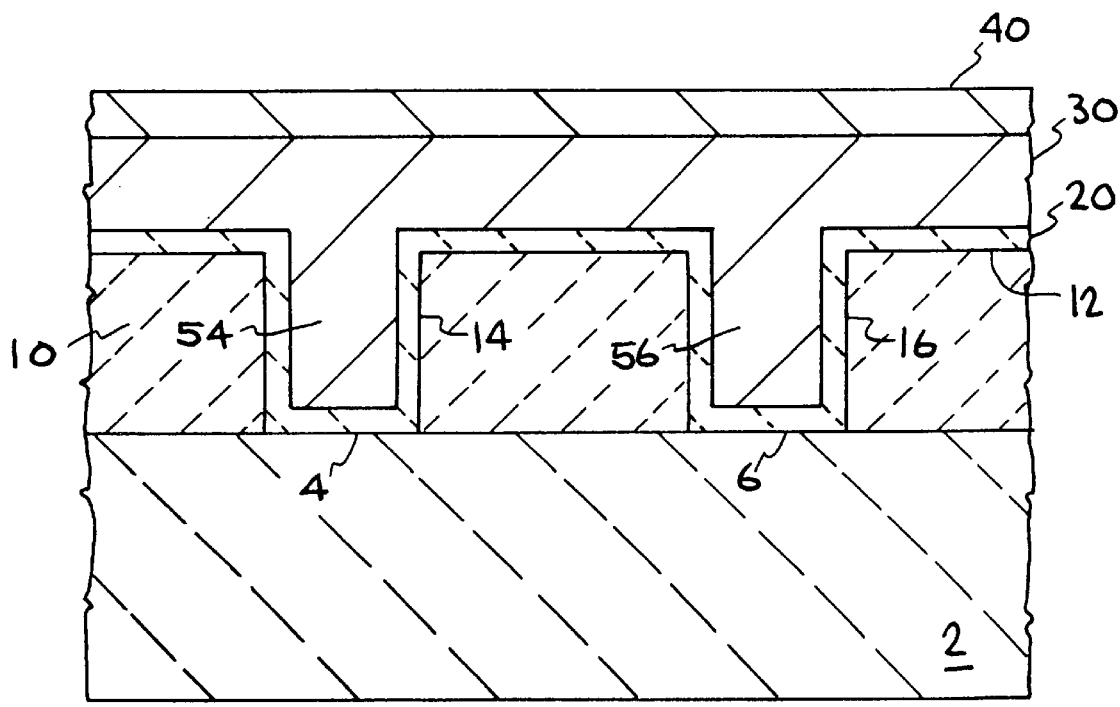
FIG. 4 is a fragmentary vertical cross-sectional view of the structure of FIG. 3 after heating the structure sufficiently to cause the compressively stressed metal layer to extrude down into the openings to completely fill the openings.

After cap layer 40 has been formed over compressively stressed metal layer 30, the extrusion step may be carried out, as illustrated in FIG. 4. This is accomplished by heating the structure to a minimum temperature at which plastic deformation of metal layer 30 will occur, but lower than the melting temperature of metal layer 30. That is, what is desired is a temperature at which compressively stressed metal layer 30 will begin to extrude into openings 14 and 16 to completely fill openings 14 and 16 while avoiding the occurrence and flow of molten metal.

The temperature must be kept below the melting point of metal layer 30, in accordance with the invention, since the use of a temperature as high as the melting point of layer 30 would be detrimental to other portions of the integrated circuit structure, including previously formed metal interconnects formed using the same metal. When compressively stressed metal layer 30 comprises aluminum, for example, the structure may be heated to a temperature range of from about 400° C. to about 500° C. to provide sufficient plastic flow, while avoiding melting of the aluminum material.

Thus, the minimum temperature to which the structure should be heated is the minimum temperature at which the compressively stressed metal layer 30 will extrude into and completely fill openings 14 and 16, while the maximum temperature is a temperature just below the melting point of metal layer 30. While the minimum and maximum extrusion temperatures may be empirically determined for any particular metal used as metal layer 30, it should be noted that optimally the extrusion step of the process will be carried out at as low a temperature as possible to also avoid damage to the underlying integrated circuit structure, including lower levels of the same metal; to avoid degradation of barrier layer 20; for processing economics; and to minimize thermal budgets, i.e., the total heat exposure of the integrated circuit structure.

The extrusion step is carried out for the minimum period of time needed to achieve the desired extrusion into openings 14 and 16 to completely fill the openings. While this minimum time period will vary with different metals and with different temperatures, typically, for aluminum heated to a temperature within a range of from about 400° C. to about 450° C., a minimum time period of about 3 minutes will suffice. Following the extrusion step, the structure may be cooled and then metal layer 30 may be conventionally patterned to form the desired metal interconnects on the surface of insulating layer 10.

The heating of the structure to at least the minimum temperature for plastic deformation of compressively stressed metal layer 30 causes metal layer 30 to begin to expand, while the presence of cap layer 40 prevents this expansion from occurring in an upwardly direction, thus forcing metal layer 30 to expand downwardly into openings 14 and 16 to achieve the desired extrusion of metal layer 30 into openings 14 and 16 to thereby completely fill openings 14 and 16, as shown at 54 and 56 in FIG. 4, to establish electrical communication, through extruded metal 54 and 56 in openings 14 and 16, between the integrated circuit structure beneath openings 14 and 16 and the remainder of metal layer 30 on the surface of insulating layer 10 and barrier layer 20. Furthermore, the process of the invention results in the same metal being used to fill openings 14 and 16 as the metal on the surface of insulating layer 10 and barrier layer 20.

To further illustrate the process of the invention, onto a silicon wafer, having integrated circuit structure previously formed thereon, may be deposited a 1.0 micron layer of $SiO_2$ as an insulating layer. A plurality of 2500 Angstrom diameter vias may then be etched through the $SiO_2$ layer to the underlying integrated circuit structure and a 250 Angstrom barrier layer of TiN then may be deposited over the $SiO_2$ insulating layer which will coat all of the exposed surfaces of the vias, including the respective exposed surfaces of the underlying integrated circuit structure at the bottoms of the vias.

The compressively stressed metal layer may then be formed over the structure by depositing about 1.0 microns of aluminum comprising 99.5 wt. % aluminum and 0.5 wt. % copper over the structure by sputter deposition, while maintaining a bias of about −150 volts on a wafer support beneath the wafer and while maintaining the wafer support at a temperature of about 90° Kelvin, and a pressure of about 2 mTorr.

After deposition of the compressively stressed aluminum layer over the structure, a cap layer comprising about 1.0 microns of carbon is then deposited over the compressively stressed aluminum layer. The structure then is heated to a temperature of about 450° C. for a period of about 180 seconds, while maintaining a pressure in the chamber of about 1 mTorr to cause the compressively stressed aluminum layer to expand and extrude into the vias without, however, melting the aluminum.

The coated wafer is then allowed to cool, removed from the heating chamber, and examiner, for example, by sectioning it to expose a cross-section of some of the vias. The structure may then examined, using a scanning electron microscope (SEM) to determine whether or not the extruded aluminum had completely filled each of the vias. Each of the sectioned vias will be found to be completely filled with the extruded aluminum, with no observable voids.

Thus the invention provides a method of filling small contact openings and/or vias in an insulating layer of an integrated circuit structure, using the same metal which is also used to form a pattern of metal interconnects over the insulating layer, by forming a metal layer in compressive stress over the insulating layer and over the openings therein, forming a high tensile strength cap layer over the compressively stressed metal layer, and then heating the structure to cause the compressively stressed metal layer to extrude into and thereby fill the openings formed in the underlying insulating layer. As a result, the need for the use of different metals to respectively fill the contact openings and/or vias, and to form the patterned metal interconnects over the insulating layer, is eliminated. This eliminates the need for additional metal depositions and additional planarization steps, reduces the complexity and cost of the process, increases the reliability, reduces particle formation possibilities, and eliminates the need for use of a higher resistivity metal as a filler for the contact openings and vias.

Having thus described the invention what is claimed is:

1. An integrated circuit structure having openings in a layer of insulating material thereon filled with aluminum extruded therein from an overlying compressively stressed aluminum layer to provide an electrical connection between one or more structures beneath said layer of insulating material and one or more contacts above said layer of insulating material which comprises:

(a) a layer of insulating material formed over integrated circuit structure, said layer of insulating material having one or more openings therein extending from an upper surface of said insulating layer to said integrated circuit structure underlying said insulating layer;

(b) a barrier layer of TiN formed over said layer of insulating material, over the sidewalls of said one or more openings therein, and over the exposed surface of said underlying integrated circuit structure;

(c) an aluminum layer formed over said barrier layer and over the top of said one or more openings in said layer of insulating material, said aluminum layer having a compressive stress ranging from about $10^8$ to about $10^{10}$ dynes/cm$^2$;

(d) a capping layer of material formed over said compressively stressed metal layer, said capping layer having a tensile strength exceeding said compressive stress of said aluminum layer; and (e) aluminum from said compressively stressed aluminum layer which has been extruded into said one or more openings in said insulating layer to completely fill said one or more openings, said aluminum extruded into said openings by heating said structure sufficiently to permit said compressively stressed aluminum layer to extrude into said one or more openings to completely fill said openings with aluminum from said aluminum layer.

2. An integrated circuit structure having openings in a layer of insulating material thereon filled with metal extruded therein from an overlying compressively stressed metal layer to provide an electrical connection between one or more structures beneath said layer of insulating material and one or more contacts above said layer of insulating material which comprises:

(a) a layer of insulating material formed over integrated circuit structure, said layer of insulating material having one or more openings therein extending from an upper surface of said insulating layer to said integrated circuit structure underlying said insulating layer;

(b) a compressively stressed metal layer, having a compressive stress ranging from about $10^8$ to about $10^{10}$ dynes/cm$^2$, formed over said insulating layer and over the top of said one or more openings therein;

(c) a capping layer of high tensile strength material formed over said compressively stressed metal layer; and (d) metal from said compressively stressed metal layer extruded into said one or more openings in said insulating layer to completely fill said one or more openings, said metal extruded into said openings by heating said structure sufficiently to permit said compressively stressed metal layer to extrude into said one or more openings to completely fill said openings with metal from said metal layer.

3. The integrated circuit structure of claim 2 which further includes a barrier layer formed over said layer of insulating material, over the sidewalls of said one or more openings therein, and over the exposed surface of said underlying integrated circuit structure and beneath said layer of compressively stressed metal.

4. The integrated circuit structure of claim 3 wherein said barrier layer comprises TiN.

5. The integrated circuit structure of claim 3 wherein said barrier layer has a thickness of at least 150 Angstroms to chemically isolate said metal layer from said integrated circuit structure beneath said insulating layer.

6. The integrated circuit structure of claim 2 wherein the compressive stress of said compressively stressed metal layer is sufficient to permit said extrusion of said metal into said openings during said heating step.

7. The integrated circuit structure of claim 2 wherein the compressive stress of said compressively stressed metal layer is less than that amount of stress which would cause other layers of said integrated circuit structure to crack.

8. The integrated circuit structure of claim 2 wherein said compressively stressed metal layer comprises an aluminum material.

9. The integrated circuit structure of claim 2 wherein said capping layer has a tensile strength sufficient to prevent said compressively stressed metal layer from extruding upwardly to form hillocks during said heating step.

10. The integrated circuit structure of claim 2 wherein said capping layer has a tensile stress exceeding the compressive stress of said metal layer.

11. The integrated circuit structure of claim 2 wherein said compressively stressed metal layer comprises an aluminum material which has been heated to a temperature of at least about 400° C. to cause said aluminum material to extrude into said openings.

12. The integrated circuit structure of claim 3 wherein said barrier layer has a thickness sufficient to chemically isolate said metal layer from said integrated circuit structure beneath said insulating layer.

13. An integrated circuit structure having one or more openings in an insulating layer filled with metal to provide an electrical connection between one or more structures beneath said insulating layer and one more contacts above said insulating layer formed by:

(a) forming over underlying portions of said integrated circuit structure a layer of insulating material having one or more openings therein extending from an upper surface of said insulating layer to said underlying portions of said integrated circuit structure underlying said insulating layer;

(b) forming over said insulating layer and over the top of each of said one or more openings therein a metal layer having a compressive stress ranging from the minimum amount of compressive stress which will permit said metal layer to extrude into said openings and completely fill said openings, to below that amount of compressive stress which would cause other layers in said integrated circuit structure to crack;

(c) forming over said metal layer a capping layer of high tensile strength material selected from the group consisting of carbon, silicon oxide (SiO$_2$), titanium, tungsten, and tantalum; and (d) then heating said structure sufficiently to permit said compressively stressed metal layer to extrude into said one or more openings to completely fill said one or more openings in said insulating layer with metal from said metal layer.

14. An integrated circuit structure having openings in a layer of insulating material thereon filled with metal extruded therein from an overlying compressively stressed metal layer to provide an electrical connection between one or more structures beneath said layer of insulating material and one or more contacts above said layer of insulating material which comprises:

(a) a layer of insulating material formed over an integrated circuit structure, said layer of insulating material having one or more openings therein extending from an upper surface of said insulating layer to said integrated circuit structure underlying said insulating layer;

(b) a metal layer formed over said insulating layer and over the top of said one or more openings therein, said metal layer having a compressive stress ranging from the minimum amount of compressive stress which will permit said metal layer to extrude into said openings and completely fill said openings, to below that amount of compressive stress which would cause other layers in said integrated circuit structure to crack;

(c) a capping layer of high tensile strength material selected from the group consisting of carbon, silicon oxide ($SiO_2$), titanium, tungsten, and tantalum and formed over said compressively stressed metal layer; and (d) metal from said compressively stressed metal layer which has been extruded into said one or more openings in said insulating layer to completely fill said one or more openings, said metal extruded into said openings by heating said structure sufficiently to permit said compressively stressed metal layer to extrude into said one or more openings to completely fill said openings with metal from said metal layer.

* * * * *